US012505947B2

(12) United States Patent
Mercier et al.

(10) Patent No.: US 12,505,947 B2
(45) Date of Patent: Dec. 23, 2025

(54) SURFACE MOUNT COMPATIBLE PLANAR MAGNETICS FOR HIGH SHOCK ENVIRONMENTS

(71) Applicant: Raytheon Company, Waltham, MA (US)

(72) Inventors: Dennis W. Mercier, Hudson, MA (US); David Dazuo Zhu, Boston, MA (US)

(73) Assignee: RAYTHEON COMPANY, Tewksbury, MA (US)

( * ) Notice: Subject to any disclaimer, the term of this patent is extended or adjusted under 35 U.S.C. 154(b) by 812 days.

(21) Appl. No.: 17/663,400

(22) Filed: May 13, 2022

(65) Prior Publication Data

US 2023/0368960 A1 Nov. 16, 2023

(51) Int. Cl.

| | |
|---|---|
| ***H01F 27/06*** | (2006.01) |
| ***H01F 27/26*** | (2006.01) |
| ***H01F 27/28*** | (2006.01) |
| ***H01F 27/30*** | (2006.01) |
| ***H05K 1/16*** | (2006.01) |

(52) U.S. Cl.

CPC ....... *H01F 27/263* (2013.01); *H01F 27/2804* (2013.01); *H01F 27/303* (2013.01); *H05K 1/165* (2013.01); *H01F 2027/2809* (2013.01); *H01F 2027/2819* (2013.01)

(58) Field of Classification Search

CPC .................................................... H01F 27/2804
USPC ...................................................... 336/65–68
See application file for complete search history.

(56) References Cited

U.S. PATENT DOCUMENTS

| | | | | |
|---|---|---|---|---|
| 3,011,140 A | | 11/1961 | Mittermaier et al. | |
| 4,283,699 A | * | 8/1981 | Ehrgott ................. | H01F 27/263 336/67 |
| 4,352,080 A | * | 9/1982 | Mitsui ..................... | H01F 17/04 336/83 |
| 4,990,880 A | * | 2/1991 | Albert ................... | H01F 27/027 336/83 |
| 5,724,016 A | | 3/1998 | Roessler et al. | |
| 5,949,321 A | | 9/1999 | Grandmont et al. | |
| 8,054,154 B2 | | 11/2011 | Koprivnak et al. | |
| 2008/0231406 A1 | * | 9/2008 | Lin ....................... | H01F 27/292 336/200 |

(Continued)

FOREIGN PATENT DOCUMENTS

WO 8303495 A1 10/1983

OTHER PUBLICATIONS

International Preliminary Report for PCT Application No. PCT/US2023/019132, Dated Nov. 28, 2024, pp. 12.

(Continued)

*Primary Examiner* — Ronald Hinson

(74) *Attorney, Agent, or Firm* — Kinney & Lange, P.A.

(57) ABSTRACT

A winding assembly, such as a transformer or an inductor, includes a spring clip and a retaining clip for mechanically coupling the winding assembly to a printed circuit board (PCB) or a printed wiring board (PWB). The clips provide structural rigidity to the winding assembly, allowing the winding assembly to remain functional during high shock events. Further, the clips compress a thermal pad positioned beneath the winding assembly, providing sufficient heat transfer surface area for transferring heat away from the winding assembly.

20 Claims, 5 Drawing Sheets

(56) References Cited

U.S. PATENT DOCUMENTS

| | | | | |
|---|---|---|---|---|
| 2019/0027293 A1* | 1/2019 | Cheon | ................ | H01F 27/2804 |
| 2021/0104352 A1* | 4/2021 | Choi | ..................... | H01F 27/255 |

OTHER PUBLICATIONS

International Search Report and Written Opinion for PCT Application No. PCT/US2023/019132, Dated Feb. 2, 2024, pp. 16.
First substantive examination report for Saudi Arabian application No. SA1120246323 dated Oct. 1, 2025, 3 pages.
Legal Examination Result for AE Application No. P2024-03003 dated Sep. 1, 2025, 1 page.

* cited by examiner

SURFACE MOUNT COMPATIBLE PLANAR MAGNETICS FOR HIGH SHOCK ENVIRONMENTS

BACKGROUND

The present invention relates to winding assembly power devices and, more particularly, to a mechanical attachment for a winding assembly power device.

As the power densities of electronic power devices (transformers, inductors, etc.) increase, custom power devices are designed to provide the requisite power for cutting edge performance. Traditionally large power devices, such as DC-DC transformers and inductors, require significant manual assembly to heat sink and solder the devices to circuit boards. The manual assembly process is time consuming, high in cost, and can create thermal expansion stresses in the components of the large power devices during the heat sinking and soldering processes. As such, there is a need for a reliable, low-cost solution for attaching large custom power devices to circuit boards. Further, there is a need for large custom power devices that can withstand high shock loads while also minimizing the thermal expansion stresses traditionally experienced during the assembly process.

SUMMARY

According to one aspect of the disclosure, a winding assembly configured to be coupled to a surface of a printed wiring board is disclosed. The winding assembly includes a winding, a ferrite core, a retaining clip, and a spring clip. The winding is at least partially surrounded by the ferrite core. The ferrite core includes a base and a cover. The retaining clip includes a first foot and a second foot, and the first foot and the second foot are positioned adjacent the surface of the printed wiring board. The spring clip is positioned at least partially over the cover of the ferrite core. The spring clip includes a third foot and a fourth foot, and the third foot and the fourth foot are positioned adjacent the surface of the printed wiring board.

DETAILED DESCRIPTION

Figure 1:
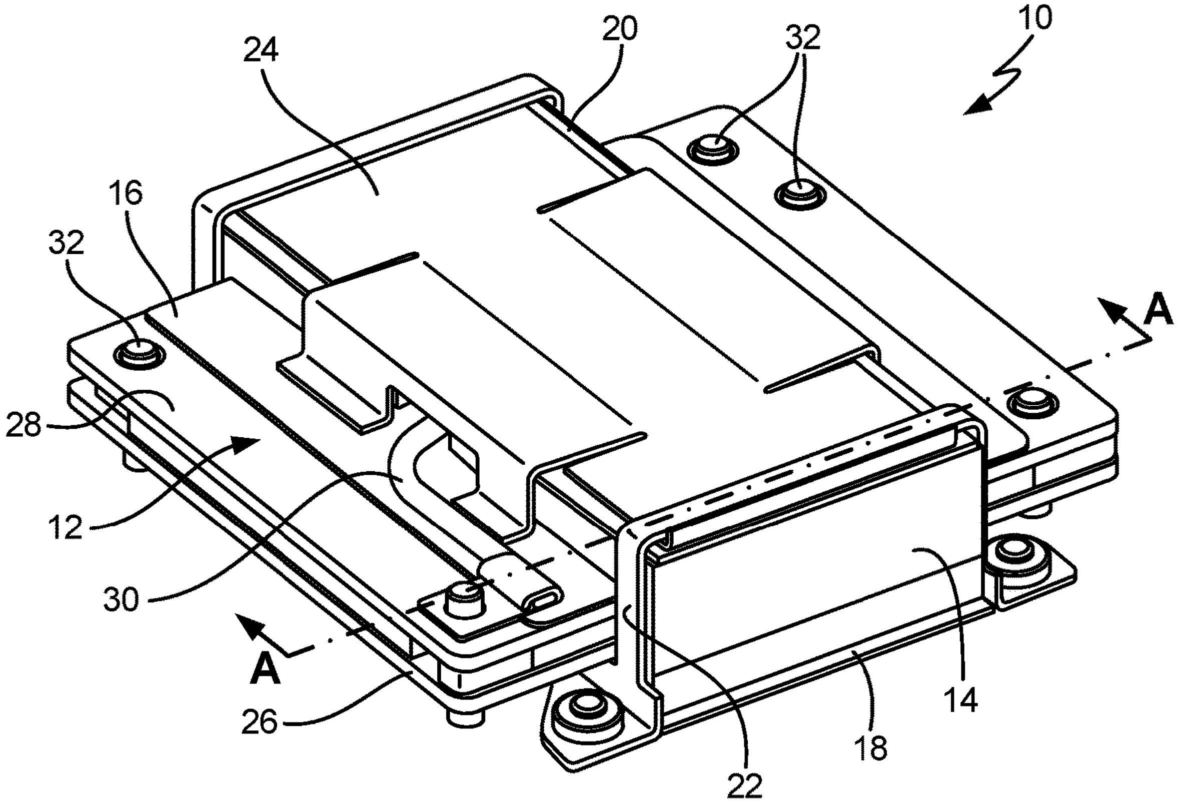
FIG. 1 is a perspective view of a first embodiment of a winding assembly.
Figure 2:
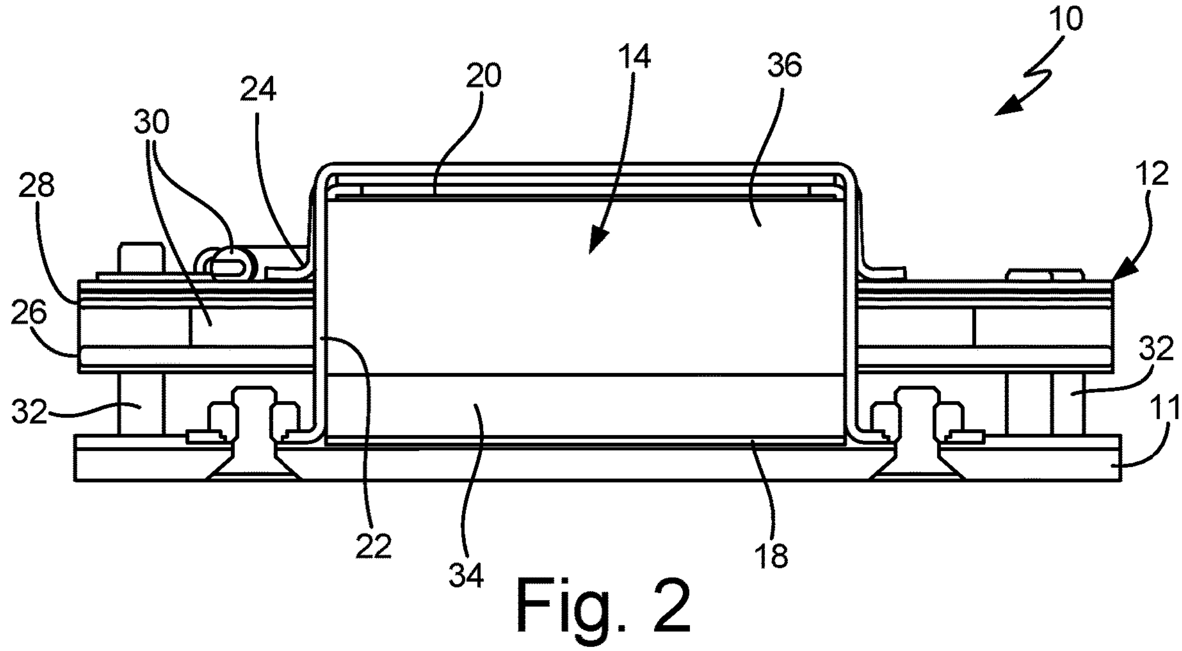
FIG. 2 is a cross-sectional view of the winding assembly taken along section line A-A of FIG. 1.
Figure 3:
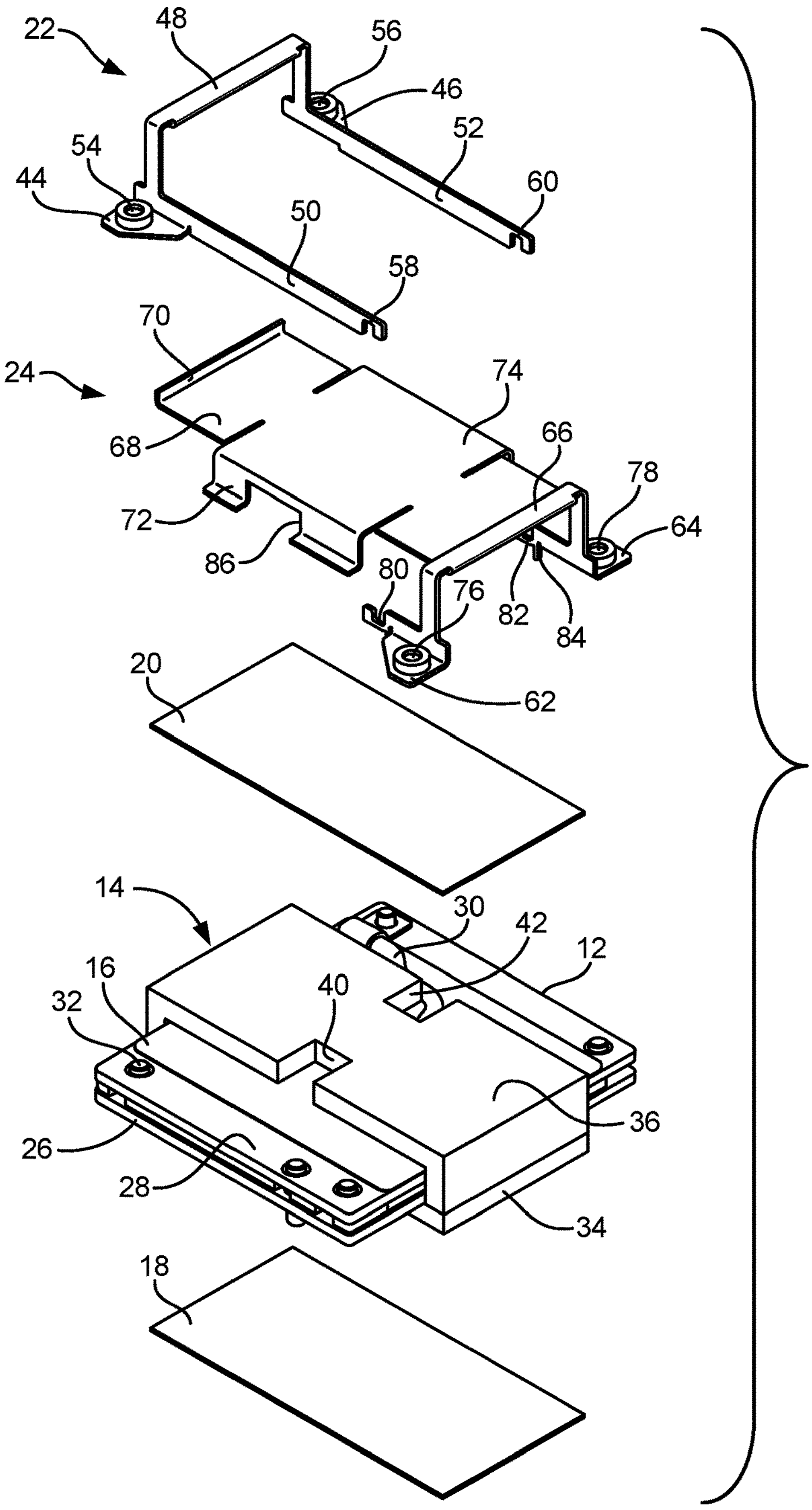
FIG. 3 is an exploded view of the first embodiment of the winding assembly.
Figure 4:
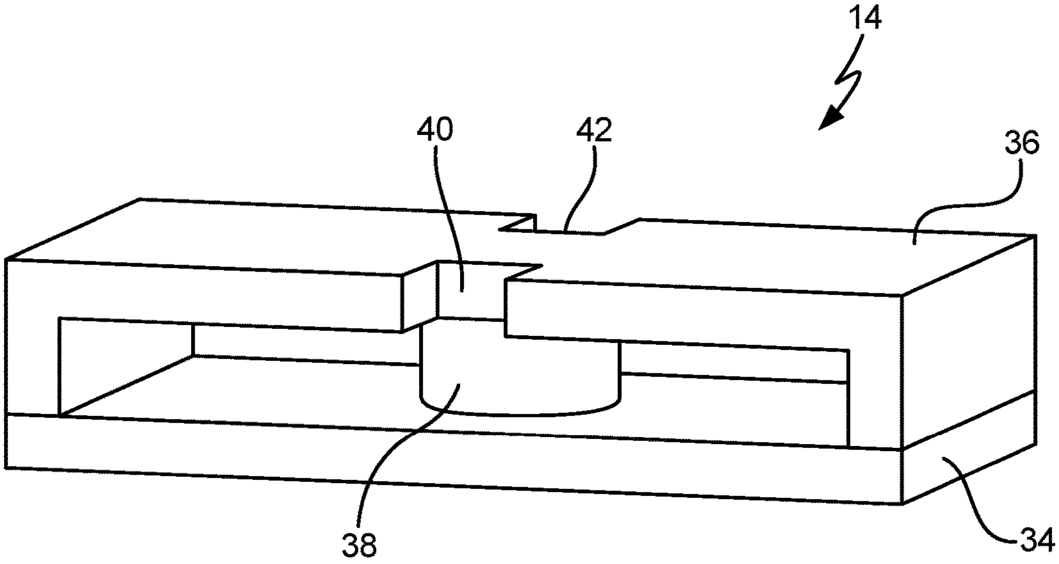
FIG. 4 is a perspective view of a ferrite core of the first embodiment of the winding assembly.
Figure 5:
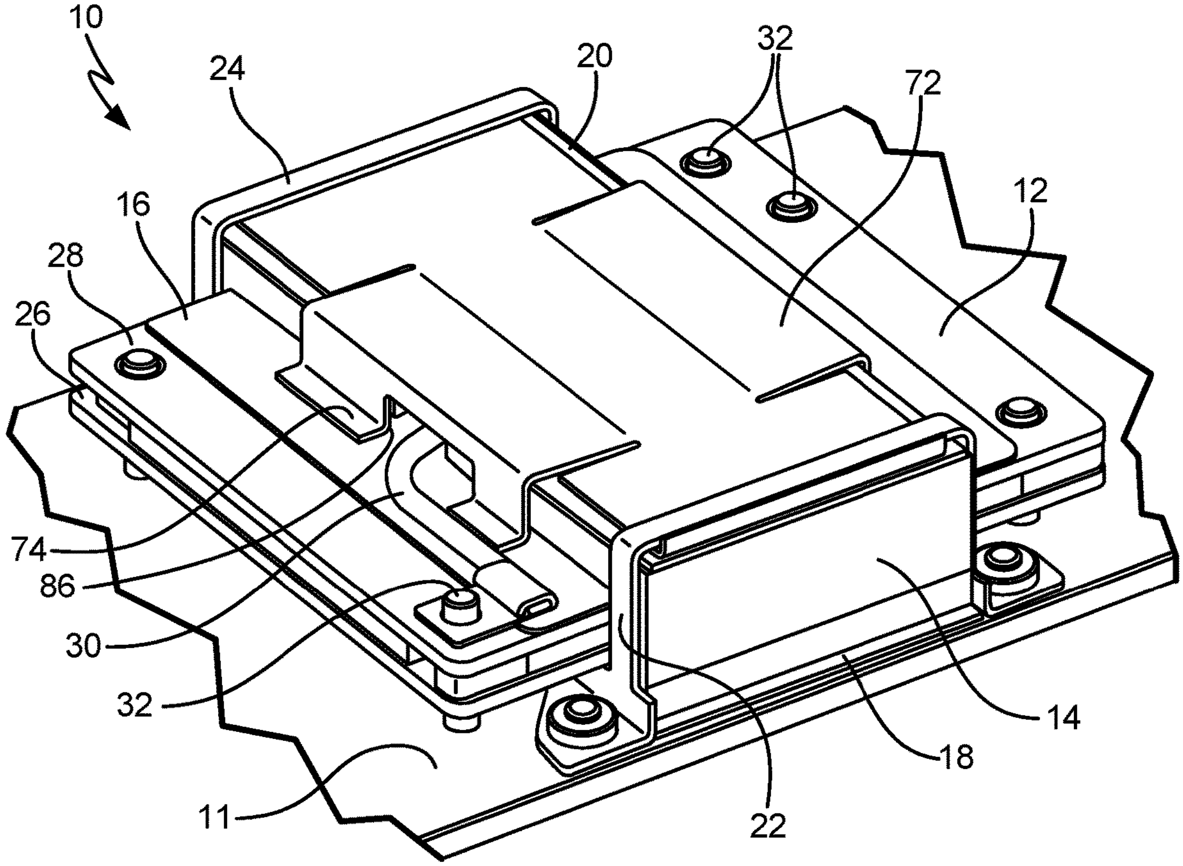
FIG. 5 is a perspective view of the first embodiment of the winding assembly coupled to a printed wiring board.

FIG. 1 is a perspective view of a first embodiment of winding assembly 10. FIG. 2 is a cross-sectional view of winding assembly 10 taken along section line A-A shown in FIG. 1. FIG. 3 is an exploded view of the first embodiment of winding assembly 10. FIG. 4 is a perspective view of ferrite core 14 of the first embodiment of winding assembly 10. FIG. 5 is a perspective view of the first embodiment of winding assembly 10 coupled to printed wiring board 11. FIGS. 1-5 will be discussed together. Winding assembly 10 includes winding 12, ferrite core 14, spacer 16, first pad 18, second pad 20, retaining clip 22, and spring clip 24. Winding assembly 10 can be a transformer, an inductor, or other electronic device configured to be electrically and mechanically coupled to printed wiring board 11. Although winding assembly 10 is discussed as being coupled to a surface of printed wiring board 11, it is to be understood that this also includes printed circuit boards, microchips, motherboards, chips, and microcircuit, among other options.

Winding 12 is the electrical core or center component of winding assembly 10, which includes current-carrying conductors wound around a center or core component. As such, winding 12 includes one or more turns of a current-carrying wire that forms a continuous coil through which an electric current can pass. In the example shown in FIG. 1, winding 12 includes 3 separate layers that are coupled together to form winding 12. Winding 12 includes first printed circuit board 26, second printed circuit board 28, continuous coil 30, and a plurality of terminals 32. Continuous coil 30 is positioned between first printed circuit board 26 and second printed circuit board 28 and continuous coil 30 is wrapped around a center or core component of winding 12 (not explicitly shown). Further, continuous coil 30 extends through second printed circuit board 28 such that an end of continuous coil 30 is electrically coupled to one of the plurality of terminals 32 through a standard electrical connection. As shown best in FIG. 5, each of the plurality of terminals 32 are electrically coupled to printed wiring board 11, allowing an electric current to pass between winding 12 and printed wiring board 11.

Ferrite core 14 is a magnetic core made of ferrite on which winding 12 is formed. As shown best in FIG. 4, ferrite core 14 includes base 34, cover 36, and circular post 38. Base 34 is generally rectangular in shape, and base 34 is coupled along its shorter edges to cover 36. Cover 36 is positioned over and coupled to base 34, and cover 36 includes first notch 40 and second notch 42. First notch 40 extends from a first outer long edge of cover 36 inward towards a center of cover 36. Second notch 42 extends from a second outer long edge of cover 36 inward towards the center of cover 36. First notch 40 and second notch 42 are included in ferrite core 14 to allow continuous coil 30 to route through ferrite core 14 without interference. As shown best in FIG. 3, a single continuous coil 30 is routed through second notch 42 and no coil is routed through first notch 40. The inclusion of both first notch 40 and second notch 42 allows for flexibility in the design of winding assembly 10 and provides the ability to route continuous coil 30 through either side of ferrite core 14. Circular post 38 is positioned generally at a center location of base 34 and cover 36 of ferrite core 14. Circular post 38 is a feature having a circular cross-section that extends from an upper surface of base 34 to an inner surface of cover 36. Circular post 38 of ferrite core 14 is the component/feature of winding assembly 10 in which continuous coils 30 are wrapped around, as previously discussed.

As shown best in FIGS. 1, 3, and 5, ferrite core 14 at least partially surrounds winding 12. More specifically, a central portion of winding 12 is surrounded and covered by cover 36 and the outer four corners of winding 12 extend outward beyond base 34 and cover 36 of ferrite core 14. In other words, when base 34 and cover 36 of ferrite core 14 are coupled together, a window or opening is formed between base 34 and cover 36. Winding 12 is positioned within the window or opening and winding 12 extends through and outward from both base 34 and cover 36, such that ferrite core 14 surrounds only a portion of winding 12. Further, winding 12 extending beyond the edges of ferrite core 14 allows each of the plurality of terminals 32 to be electrically coupled to printed wiring board 11. In some examples, each of the plurality of terminals 32 may be coupled to electrical contacts on printed wiring board 11 through a plurality of solders.

Spacer 16 is positioned between an upper surface of winding 12 and a lower or inner surface of cover 36 of ferrite core 14. Further, spacer 16 extends beyond the outer edges of two sides of cover 36. More specifically, spacer 16 extends beyond both long edges of cover 36 in a direction perpendicular to the long edges of cover 36. Spacer 16 extends beyond both long edges of cover 36 such that an area of spacer 16 is present beyond both long edges of cover 36. In the example shown, spacer 16 is a thin rectangular sheet but, in another example, spacer 16 can have any shape conforming generally to the outer perimeter of winding 12. In some examples, spacer 16 can be constructed from G10, FR4, or other composite material. Spacer 16 is configured to prevent abrasive damage to the top surface of winding 12 by providing a surface for features of spring clip 24 to contact and slide or rub against, discussed further below. Further, spacer 16 is configured to provide electrical insulation between spring clip 24 and winding 12, preventing the flow of electrical current between the components.

In the example shown, a small gap is present between an upper surface of spacer 16 and the lower or inner surface of cover 36. The small gap allows for thermal expansion of winding 12, spacer 16, and ferrite core 14 when each component increases in temperature, while also preventing cracking or damage to ferrite core 14 due to differing coefficient of thermal expansion characteristics between each component. More specifically, the small gap provides a location for windings 12 to increase in size vertically, due to thermal expansion, without inducing stresses into ferrite core 14. If the small gap was not present and winding 12 was directly abutting cover 36, ferrite core 14 could crack due to the forces exerted to ferrite core during the thermal expansion of the components. In other examples where the coefficient of thermal expansion for each component is similar, the small gap may not be present.

As shown best in FIGS. 2-3, first pad 18 is positioned between a lower surface of base 34 of ferrite core 14 and an upper surface of printed wiring board 11. Second pad 20 is positioned between an upper surface of cover 36 of ferrite core 14 and a lower or inner surface of spring clip 24, discussed further below. In the example shown, first pad 18 and second pad 20 both have a rectangular shape and are sized to be about the same size as the outer perimeter of base 34 and cover 36, respectively. In another example, first pad 18 and second pad 20 can have any shape that generally conforms to the outer perimeter of base 34 and cover 36, respectively. In some examples, first pad 18 and second pad 20 are constructed from a graphite material having a maximum operating temperature of at least 235 degrees Celsius. In other examples, first pad 18 and second pad 20 can be constructed from any material having a maximum operating temperature of at least 235 degrees Celsius. First pad 18 and second pad 20 having a maximum operating temperature of at least 235 degrees Celsius allows winding assembly 10 to go through the reflow process without melting or damaging first pad 18 and second pad 20. In other words, first pad 18 and second pad 20 having a maximum operating temperature below 235 degrees Celsius could result in damage or negative effects to first pad 18 and second pad 20 during the reflow process.

First pad 18 is configured to transfer heat generated by winding 12 away from winding 12, through printed wiring board 11, and out through a baseplate of printed wiring board 11. As such, it is beneficial to compress first pad 18 below base 34 of ferrite core 14 to ensure sufficient heat transfer surface area is present between winding assembly 10 and printed wiring board 11. Compressing first pad 18 ensures no ridges or air gaps are present between the bottom surface of first pad 18 and printed wiring board 11, and also ensures maximum heat transfer by utilizing the maximum amount of available heat transfer surface area of first pad 18. Second pad 20 can also provide some heat transfer from ferrite core 14 out to the ambient environment. But second pad 20 is mainly configured to equally distribute the compressive force induced by spring clip 24 and retaining clip 22 onto ferrite core 14. As such, second pad 20 is configured to provide a surface area that ensures equal compression of winding assembly 10 to create better heat transfer characteristics by equally compressing the surface area of first pad 18 positioned under base 34 of ferrite core 14.

Retaining clip 22 and spring clip 24 are both positioned over ferrite core 14, first pad 18, and second pad 20, and both retaining clip 22 and spring clip 24 are coupled to printed wiring board 11. Together, retaining clip 22 and spring clip 24 are configured to compress ferrite core 14, first pad 18, and second pad 20 downward towards printed wiring board 11. Further, retaining clip 22 and spring clip 24 are also configured to apply a downward force onto winding 12, discussed further below. In the embodiment shown, retaining clip 22 and spring clip 24 are described as being separate components that interface with each other to secure winding 12 to printed wiring board 11. In another embodiment, retaining clip 22 and spring clip 24 could be a single component that is configured to secure winding 12 to printed wiring board 11. Retaining clip 22 includes first foot 44, second foot 46, upper member 48, first arm 50, second arm 52, first threaded insert 54, second threaded insert 56, first hook 58, and second hook 60.

First foot 44 and second foot 46 are flanges of retaining clip 22 that are oriented generally parallel to the upper surface of printed wiring board 11, and generally parallel with each other. First foot 44 and second foot 46 are configured to directly abut the upper surface of printed wiring board 11 when retaining clip 22 is coupled to printed wiring board 11. More specifically, first foot 44 includes first threaded insert 54 coupled to first foot 44 and second foot 46 includes second threaded insert 56 coupled to second foot 46. In some examples, first threaded insert 54 and second threaded insert 56 can be coupled to first foot 44 and second foot 46, respectively, through a press-fitting operation, an outer-diameter threaded connection, or a welded connection, among other options. First threaded insert 54 and second threaded insert 56 are configured to receive fasteners, for example, threaded fasteners, that extend through printed wiring board 11 from the underside of printed wiring board 11 upward towards winding assembly 10. As such, first threaded insert 54 and second threaded insert 56 are configured to secure retaining clip 22 to printed wiring board 11. In another example, first foot 44 and second foot 46 can include apertures extending through first foot 44 and second foot 46, allowing a fastener to extend through first foot 44 and second foot 46 to be coupled with threaded inserts positioned within printed wiring board 11

Upper member 48 of retaining clip 22 is a generally U-shaped member that extends between and connects first foot 44 and second foot 46. In other words, upper member 48 extends from first foot 44 vertically upward, then horizontally, then vertically downward (creating the U-shaped member), and then connects to second foot 46. Upper member 48 is configured to provide structure and support between first foot 44 and second foot 46, and therefore the overall retaining clip 22. Upper member 48 can be constructed from a metallic sheet metal or other thin metallic material that can withstand bending operations to form the final shape of upper member 48. Extending from first foot 44, second foot 46, and upper member 48 are first arm 50 and second arm 52.

More specifically, first arm 50 extends outward from first foot 44 and upper member 48 at a perpendicular angle with respect to the vertically extending portion of upper member 48. Likewise, second arm 52 extends outward from second foot 46 and upper member 48 at a perpendicular angle with respect to the vertically extending portion of upper member 48. First arm 50 is positioned parallel with second arm 52, such that first arm 50 and second arm 52 extend in the same direction. First arm 50 and second arm 52 can be constructed from a metallic sheet metal or other thin metallic material, similar to upper member 48. First arm 50 includes first hook 58 positioned at a distal free end of first arm 50. In other words, the end of first arm 50 not coupled to first foot 44 includes first hook 58. Second arm 52 includes second hook 60 positioned at a distal free end of second arm 52. In other words, the end of second arm 52 not coupled to second foot 46 includes second hook 60. First hook 58 and second hook 60 are configured to mate with and be coupled to features of spring clip 24, discussed below.

Spring clip 24 includes third foot 62, fourth foot 64, top member 66, body 68, lip 70, first contact 72, second contact 74, third threaded insert 76, fourth threaded insert 78, first catch 80, second catch 82, and alignment pin 84. Although spring clip 24 is described as having one alignment pin 84, it is to be understood that in another embodiment spring clip 24 could include more than one alignment pin 84 to aid in properly aligning spring clip 24 within winding assembly 10.

Third foot 62 and fourth foot 64 are flanges of spring clip 24 that are oriented generally parallel to the upper surface of printed wiring board 11, and generally parallel with each other. Third foot 62 and fourth foot 64 are configured to directly abut the upper surface of printed wiring board 11 when spring clip 24 is coupled to printed wiring board 11. More specifically, third foot 62 includes third threaded insert 76 coupled to third foot 62 and fourth foot 64 includes fourth threaded insert 78 coupled to fourth foot 64. In some examples, third threaded insert 76 and fourth threaded insert 78 can be coupled to third foot 62 and fourth foot 64, respectively, through a press-fitting operation, an outer-diameter threaded connection, or a welded connection, among other options. Third threaded insert 76 and fourth threaded insert 78 are configured to receive fasteners, for example, threaded fasteners, that extend through printed wiring board 11 from the underside of printed wiring board 11 upward towards winding assembly 10. As such, third threaded insert 76 and fourth threaded insert 78 are configured to secure spring clip 24 to printed wiring board 11. In another example, third foot 62 and fourth foot 64 can include apertures extending through third foot 62 and fourth foot 64, allowing a fastener to extend through third foot 62 and fourth foot 64 to be coupled with threaded inserts positioned within printed wiring board 11

Top member 66 of spring clip 24 is a generally U-shaped member that extends between and connects third foot 62 and fourth foot 64. In other words, top member 66 extends from third foot 62 vertically upward, then horizontally, then vertically downward (creating the U-shaped member), and then connects to fourth foot 64. Top member 66 is configured to provide structure and support between third foot 62 and fourth foot 64, and therefore the overall spring clip 24. Top member 66 can be constructed from a metallic sheet metal or other thin metallic material that can withstand bending operations to form the final shape of top member 66. Coupled to and extending from top member 66 is body 68.

Body 68 is coupled at one end to top member 66 of spring clip 24, body 68 extends outward from top member 66, and body 68 has a free end positioned opposite the end coupled to top member 66. Body 68 is a generally flat sheet metal or other thin metallic material. Body 68 has a generally rectangular shape, similar to the shape of cover 36 of ferrite core 14. In some examples, body 68 can be coupled to top member 66 through a welded connection, an adhesive, or other means for coupling metallic materials together. In another example, body 68 and top member 66 can be formed from a single piece of material and bending operations can be used to produce the desired shape of top member 66 and body 68. The free end of body 68 includes lip 70 extending upward at an angle away from body 68. In some examples, the angle can be a perpendicular angle. Lip 70 is configured to provide a location that secures and holds upper member 48 of retaining clip 22 to spring clip 24 when winding assembly 10 is assembled on printed wiring board 11, discussed further below.

As shown best in FIG. 3, body 68 includes first contact 72 and second contact 74 extending from opposite sides of body 68. More specifically, first contact 72 extends from a first edge of body 68 and second contact 74 extends from a second edge of body 68. First contact 72 and second contact 74 extend downward towards third foot 62 and fourth foot 64, respectively. In some examples, the upper portion of first contact 72 and second contact 74 that is coupled to body 68 can be positioned parallel with the flat top surface of body 68. In other examples, the upper portion of first contact 72 and second contact 74 that is coupled to body 68 can be positioned at an acute angle with respect to the flat top surface of body 68. As such, in some examples, the upper portion of first contact 72 and second contact 74 that is coupled to body 68 can extend upwards away from body 68 at a slight angle. First contact 72 and second contact 74 each include a first bend and a second bend. More specifically, first contact 72 and second contact 74 each include a portion extending outward away from outer edges of body 68. Then first contact 72 and second contact 74 change direction at the first bend and extend downwards towards third foot 62 and fourth foot 64. Next, first contact 72 and second contact 74 change direction again at the second bend and again extend outward away from body 68. In some examples, a portion of each of first contact 72 and second contact 74 is perpendicular to body 68 and another portion of each of first contact 72 and second contact 74 is parallel with body 68.

First contact 72 and second contact 74 are positioned adjacent and directly contacting spacer 16 to induce a compressive force on spacer 16. As such, first contact 72 and second contact 74 are configured to flex upward away from spacer 16 as first contact 72 and second contact 74 press down onto spacer 16. This creates the compressive force that pushes spacer 16, winding 12, ferrite core 14, and first pad 18 downward towards printed wiring board 11. As discussed, spacer 16 is sized and positioned such that first contact 72 and second contact 74 press against spacer 16 and not directly onto winding 12, preventing abrasive damage to winding 12. As shown in FIG. 3, first contact 72 includes cutout 86 extending fully through first contact 72 of spring clip 24. As shown in FIG. 5, second contact 74 includes cutout 86 extending fully through second contact 74 of spring clip 24. Cutouts 86 are apertures extending fully through first contact 72 and second contact 74, allowing continuous coil 30 to extend from within ferrite core 14 to outside ferrite core 14, such that continuous coil 30 can be coupled to one of the plurality of terminals 32 of winding 12.

Spring clip 24 also includes first catch 80, second catch 82, and alignment pin 84. First catch 80 is coupled to and extends from third foot 62 and second catch 82 is coupled to and extends from fourth foot 64. First catch 80 and second catch 82 are upward facing features that are configured to mate with and be coupled to the downward facing first hook 58 and second hook 60 of retaining clip 22. More specifically, first hook 58 of retaining clip 22 is configured to mate with and be coupled to first catch 80 of spring clip 24 and second hook 60 of retaining clip 22 is configured to mate with and be coupled to second catch 82 of spring clip 24. As such, first hook 58 and first catch 80 have mating geometry and second hook 60 and second catch 82 have mating geometry, allowing the features to mate and couple together. The coupling of first hook 58 with first catch 80 and second hook 60 with second catch 82 secures retaining clip 22 to spring clip 24 when winding assembly 10 is assembled and in use. Further, the coupling of first hook 58 with first catch 80 and second hook 60 with second catch 82 prevents retaining clip 22 and spring clip 24 from pulling apart or away from each other during high shock events. Alignment pin 84 is positioned adjacent and extending from second catch 82, and alignment pin 84 extends away from second catch 82 and fourth foot 64. Alignment pin 84 is configured to mate with an aperture within printed wiring board 11 to properly align winding assembly 10 on printed wiring board 11 during assembly of winding assembly to printed wiring board 11.

When assembled, retaining clip 22 and spring clip 24 are configured to compress winding 12, ferrite core 14, first pad 18, and second pad 20 downward towards printed wiring board 11 to secure winding 12 when in use. First foot 44, second foot 46, third foot 62, and fourth foot 64 along with first threaded insert 54, second threaded insert 56, third threaded insert 76, and fourth threaded insert 78 are utilized to mechanically couple winding assembly 10 to printed wiring board 11. Winding assembly 10 aids in coupling large surface mount power devices to printed wiring board 11, which minimizes stresses on the solder joints which were previously used to secure winding 12 to printed wiring board 11. Further, winding assembly 10 securely couples winding 12 to printed wiring board 11, allowing winding assembly 10 to stay secured and operational during high shock events. Winding assembly 10 provides advantages for securing large surface mount power devices to printed wiring boards over previous solder coupling approaches.

Figure 6A:
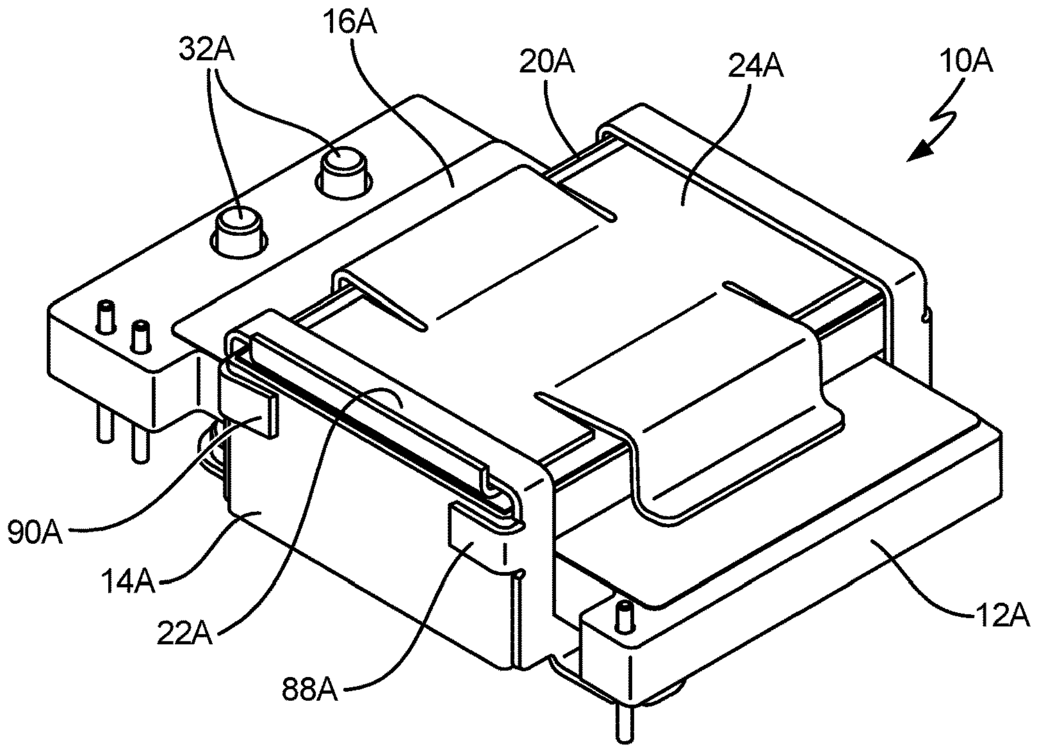
FIG. 6A is a first perspective view of a second embodiment of a winding assembly.
Figure 6B:
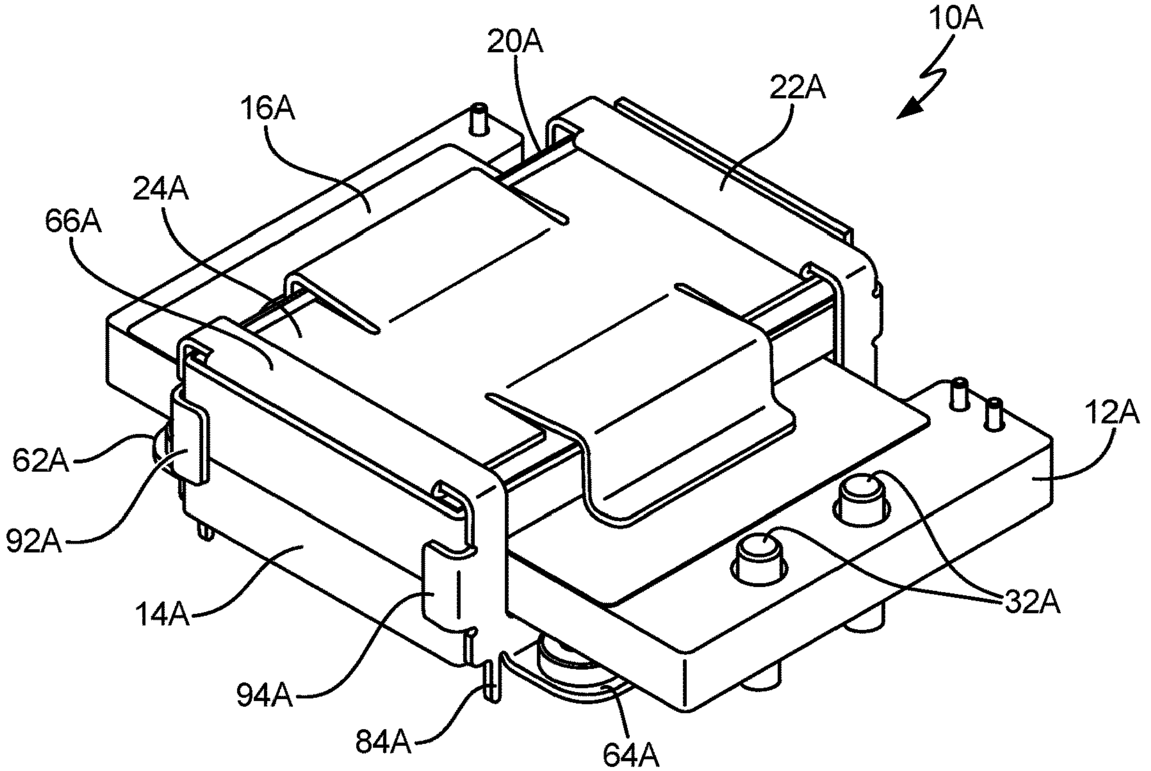
FIG. 6B is a second perspective view of the second embodiment of the winding assembly of FIG. 6A.
Figure 7:
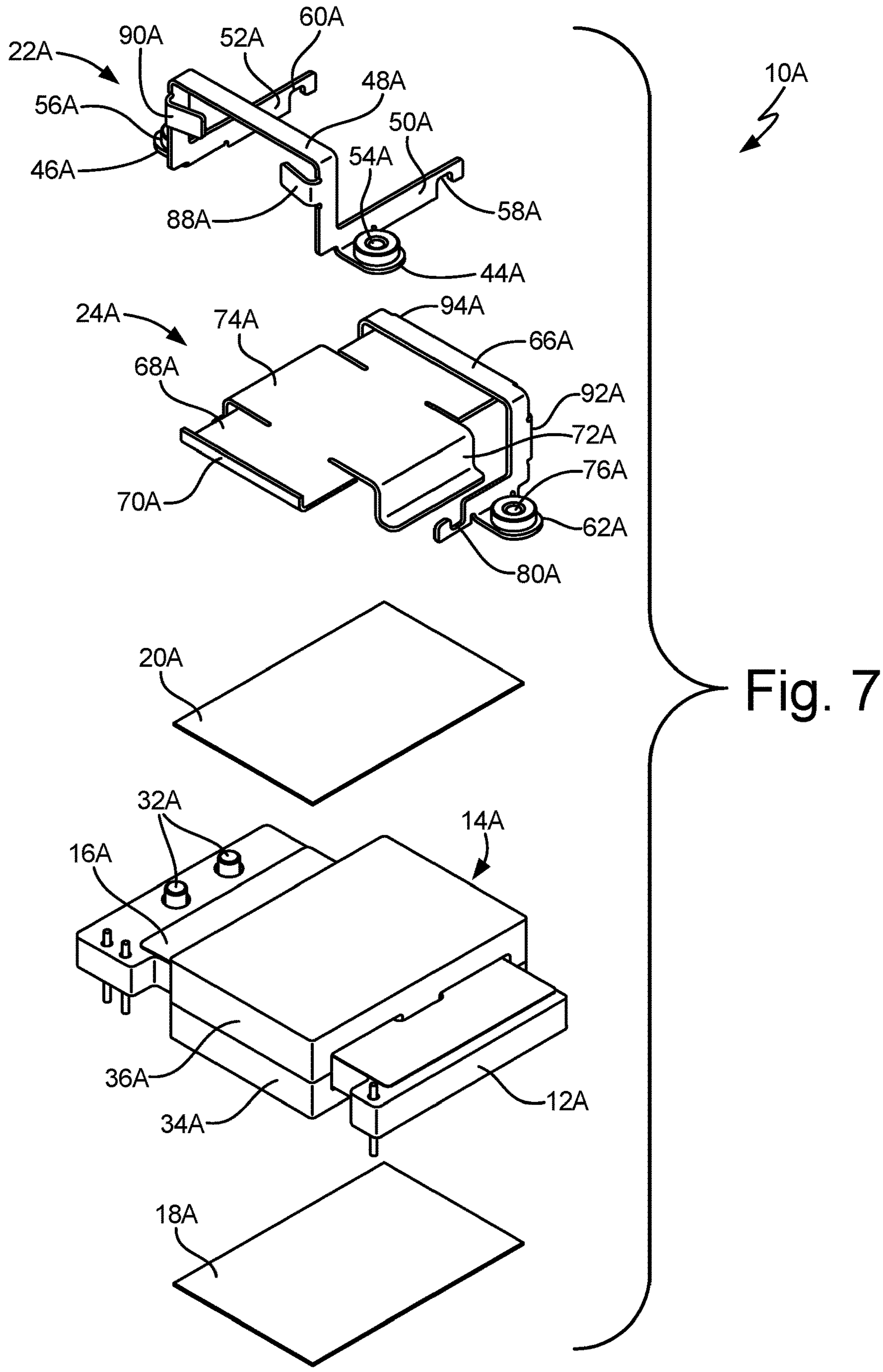
FIG. 7 is an exploded view of the second embodiment of the winding assembly.

FIG. 6A is a first perspective view of a second embodiment of winding assembly 10A. FIG. 6B is a second perspective view of the second embodiment of winding assembly 10A shown in FIG. 6A. FIG. 7 is an exploded view of the second embodiment of winding assembly 10A. FIGS. 6A-7 will be discussed together. Winding assembly 10A is substantially similar to winding assembly 10, and it is to be understood that the disclosure regarding winding assembly 10 equally applies to winding assembly 10A unless otherwise described. To avoid redundancy, only the differences between winding assembly 10A and winding assembly 10 will be discussed below.

The first difference between winding assembly 10A and winding assembly 10 is that retaining clip 22A of winding assembly 10A includes first biasing arm 88A and second biasing arm 90A. As shown best in FIG. 7, first biasing arm 88A extends from a first side of the generally U-shaped upper member 48A inwards toward a center of the generally U-shaped upper member 48A. Second biasing arm 90A extends from a second side of the generally U-shaped upper member 48A inwards toward the center of the generally U-shaped upper member 48A. Further, first biasing arm 88A and second biasing arm 90A are positioned above the midpoint of the vertically extending portions of upper member 48A. First biasing arm 88A and second biasing arm 90A are configured to induce a force on ferrite core 14A to further aid in securing ferrite core 14A within winding assembly 10A. More specifically, first biasing arm 88A and second biasing arm 90A induce a force on ferrite core 14A to secure ferrite core 14A horizontally within winding assembly 10A, preventing ferrite core 14A from sliding or moving within winding assembly 10A when in use and/or during high shock events.

The second difference between winding assembly 10A and winding assembly 10 is that spring clip 24A of winding assembly 10A includes first stop 92A and second stop 94A. As shown best in FIG. 6B, first stop 92A extends from a first side of the generally U-shaped top member 66A inwards toward a center of the generally U-shaped top member 66A. Second stop 94A extends from a second side of the generally U-shaped top member 66A inwards toward the center of the generally U-shaped top member 66A. First stop 92A and second stop 94A are configured to provide an abutting surface for ferrite core 14A, which is being pushed by first biasing arm 88A and second biasing arm 90A towards first stop 92A and second stop 94A. As such, first stop 92A and second stop 94A aid in preventing ferrite core 14A from sliding or moving within winding assembly 10A when in use and/or during high shock events.

Winding assembly 10A is another embodiment that aids in coupling large surface mount power devices to printed wiring boards, which minimizes stresses on the solder joints which were previously used to secure winding 12A to printed wiring boards. Further, winding assembly 10A securely couples winding 12A to printed wiring boards, allowing winding assembly 10A to stay secured and operational during high shock events. Winding assembly 10A provides advantages for securing large surface mount power devices to printed wiring boards over previous solder coupling approaches.

Discussion of Possible Embodiments

The following are non-exclusive descriptions of possible embodiments of the present invention.

A winding assembly configured to be coupled to a surface of a printed wiring board, the winding assembly comprising: a winding at least partially surrounded by a ferrite core, the ferrite core comprising a base and a cover; a retaining clip comprising a first foot and a second foot, wherein the first foot and the second foot are positioned adjacent the surface of the printed wiring board; and a spring clip positioned at least partially over the cover of the ferrite core, the spring clip comprising a third foot and a fourth foot, wherein the third foot and the fourth foot are positioned adjacent the surface of the printed wiring board.

The winding assembly of the preceding paragraph can optionally include, additionally and/or alternatively, any one or more of the following features, configurations and/or additional components:

The retaining clip further comprises: an upper member extending between and connecting the first foot and the second foot, wherein the upper member is a generally U-shaped member; and a first arm extending perpendicularly from the upper member, and a second arm extending perpendicularly from the upper member, wherein the first arm is positioned parallel to the second arm.

The first arm includes a first hook positioned at a distal free end of the first arm, and wherein the second arm includes a second hook positioned at a distal free end of the second arm.

A first biasing arm extends from a first side of the generally U-shaped upper member inwards toward a center of the generally U-shaped upper member, and wherein a second biasing arm extends from a second side of the generally U-shaped upper member inwards toward the center of the generally U-shaped upper member.

A first threaded insert is coupled to the first foot of the retaining clip, and wherein a second threaded insert is coupled to the second foot of the retaining clip.

The spring clip further comprises: a top member extending between and connecting the third foot and the fourth foot, wherein the top member is a generally U-shaped member; a body coupled to and extending from the top member, the body including an upward facing lip positioned at a distal free end of the body; and a first contact extending from a first edge of the body and a second contact extending from a second edge of the body, wherein the first contact and the second contact extend from the body toward the third foot and the fourth foot, respectively.

A first stop extends from a first side of the generally U-shaped top member inwards toward a center of the generally U-shaped top member, and wherein a second stop extends from a second side of the generally U-shaped top member inwards toward the center of the generally U-shaped top member.

A cutout extends through the first contact of the spring clip, and wherein the cutout allows an electrical connector to extend from within the ferrite core to outside the ferrite core.

The first contact and the second contact each comprise a first bend and a second bend, such that a portion of each of the first contact and the second contact is perpendicular to the body and another portion of each of the first contact and the second contact is parallel with the body.

The spring clip further comprises a first catch extending from the third foot and a second catch extending from the fourth foot, and wherein an alignment pin is positioned adjacent the second catch and extends away from the second catch and the fourth foot.

A third threaded insert is coupled to the third foot of the spring clip, and wherein a fourth threaded insert is coupled to the fourth foot of the spring clip.

A first pad positioned between the surface of the printed wiring board and a bottom surface of the base of the ferrite core.

A second pad positioned between an upper surface of the cover of the ferrite core and an inner surface of the spring clip.

The first pad and the second pad are constructed from a material having a maximum operating temperature of at least 235 degrees Celsius.

A spacer is positioned between the winding and the cover of the ferrite core, and wherein the spacer extends beyond an outer edge of the cover.

A first contact and a second contact of the spring clip are positioned adjacent and directly contact the spacer, and wherein the first contact and the second contact are configured to induce a compressive force on the spacer.

The cover of the ferrite core includes a first notch extending from a first outer edge of the cover toward a center of the cover, and wherein the ferrite core includes a second notch extending from a second outer edge of the cover toward a center of the cover.

The ferrite core includes a circular post positioned generally at a center location of the ferrite core, and wherein the circular post extends from an upper surface of the base to an inner surface of the cover.

The winding includes a plurality of coils wrapped around the circular post of the ferrite core, and wherein an end of the plurality of coils is coupled to a terminal of the winding.

The winding includes a plurality of terminals extending from the winding, and wherein the plurality of terminals are configured to be electrically coupled to the printed wiring board.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A winding assembly configured to be coupled to a surface of a printed wiring board, the winding assembly comprising:

a winding at least partially surrounded by a ferrite core, the ferrite core comprising a base and a cover;

a retaining clip comprising a first foot and a second foot, wherein the first foot and the second foot are positioned adjacent the surface of the printed wiring board; and a spring clip positioned at least partially over the cover of the ferrite core, the spring clip comprising a third foot and a fourth foot, wherein the third foot and the fourth foot are positioned adjacent the surface of the printed wiring board;

wherein a spacer is positioned between the winding and the cover of the ferrite core, and wherein the spacer extends beyond an outer edge of the cover;

wherein a first contact and a second contact of the spring clip are positioned adjacent and directly contact the spacer, and wherein the first contact and the second contact are configured to induce a compressive force on the spacer.

2. The winding assembly of claim 1, wherein the retaining clip further comprises:

an upper member extending between and connecting the first foot and the second foot, wherein the upper member is a generally U-shaped member; and a first arm extending perpendicularly from the upper member, and a second arm extending perpendicularly from the upper member, wherein the first arm is positioned parallel to the second arm.

3. The winding assembly of claim 2, wherein the first arm includes a first hook positioned at a distal free end of the first arm, and wherein the second arm includes a second hook positioned at a distal free end of the second arm.

4. The winding assembly of claim 2, wherein a first biasing arm extends from a first side of the generally U-shaped upper member inwards toward a center of the generally U-shaped upper member, and wherein a second biasing arm extends from a second side of the generally U-shaped upper member inwards toward the center of the generally U-shaped upper member.

5. The winding assembly of claim 1, wherein a first threaded insert is coupled to the first foot of the retaining clip, and wherein a second threaded insert is coupled to the second foot of the retaining clip.

6. The winding assembly of claim 1, wherein the spring clip further comprises:

a top member extending between and connecting the third foot and the fourth foot, wherein the top member is a generally U-shaped member;

a body coupled to and extending from the top member, the body including an upward facing lip positioned at a distal free end of the body; and a first contact extending from a first edge of the body and a second contact extending from a second edge of the body, wherein the first contact and the second contact extend from the body toward the third foot and the fourth foot, respectively.

7. The winding assembly of claim 6, wherein a first stop extends from a first side of the generally U-shaped top member inwards toward a center of the generally U-shaped top member, and wherein a second stop extends from a second side of the generally U-shaped top member inwards toward the center of the generally U-shaped top member.

8. The winding assembly of claim 6, wherein a cutout extends through the first contact of the spring clip, and wherein the cutout allows an electrical connector to extend from within the ferrite core to outside the ferrite core.

9. The winding assembly of claim 6, wherein the first contact and the second contact each comprise a first bend and a second bend, such that a portion of each of the first contact and the second contact is perpendicular to the body and another portion of each of the first contact and the second contact is parallel with the body.

10. The winding assembly of claim 1, wherein the spring clip further comprises a first catch extending from the third foot and a second catch extending from the fourth foot, and wherein an alignment pin is positioned adjacent the second catch and extends away from the second catch and the fourth foot.

11. The winding assembly of claim 1, wherein a third threaded insert is coupled to the third foot of the spring clip, and wherein a fourth threaded insert is coupled to the fourth foot of the spring clip.

12. The winding assembly of claim 1 and further comprising a first pad positioned between the surface of the printed wiring board and a bottom surface of the base of the ferrite core.

13. The winding assembly of claim 12 and further comprising a second pad positioned between an upper surface of the cover of the ferrite core and an inner surface of the spring clip.

14. The winding assembly of claim 13, wherein the first pad and the second pad are constructed from a material having a maximum operating temperature of at least 235 degrees Celsius.

15. The winding assembly of claim 1, wherein the cover of the ferrite core includes a first notch extending from a first outer edge of the cover toward a center of the cover, and wherein the ferrite core includes a second notch extending from a second outer edge of the cover toward a center of the cover.

16. The winding assembly of claim 1, wherein the ferrite core includes a circular post positioned generally at a center location of the ferrite core, and wherein the circular post extends from an upper surface of the base to an inner surface of the cover.

17. The winding assembly of claim 16, wherein the winding includes a continuous coil wrapped around the circular post of the ferrite core, and wherein an end of the continuous coil is coupled to a terminal of the winding.

18. The winding assembly of claim 1, wherein the winding includes a plurality of terminals extending from the winding, and wherein the plurality of terminals are configured to be electrically coupled to the printed wiring board.

19. A winding assembly configured to be coupled to a surface of a printed wiring board, the winding assembly comprising:

a winding at least partially surrounded by a ferrite core, the ferrite core comprising a base and a cover;

a retaining clip comprising a first foot and a second foot, wherein the first foot and the second foot are positioned adjacent the surface of the printed wiring board; and a spring clip positioned at least partially over the cover of the ferrite core, the spring clip comprising a third foot and a fourth foot, wherein the third foot and the fourth foot are positioned adjacent the surface of the printed wiring board, wherein the spring clip further comprises:

a top member extending between and connecting the third foot and the fourth foot, wherein the top member is a generally U-shaped member;

a body coupled to and extending from the top member, the body including an upward facing lip positioned at a distal free end of the body; and a first contact extending from a first edge of the body and a second contact extending from a second edge of the body, wherein the first contact and the second contact extend from the body toward the third foot and the fourth foot, respectively.

20. A winding assembly configured to be coupled to a surface of a printed wiring board, the winding assembly comprising:

a winding at least partially surrounded by a ferrite core, the ferrite core comprising a base and a cover;

a retaining clip comprising a first foot and a second foot, wherein the first foot and the second foot are positioned adjacent the surface of the printed wiring board; and a spring clip positioned at least partially over the cover of the ferrite core, the spring clip comprising a third foot and a fourth foot, wherein the third foot and the fourth foot are positioned adjacent the surface of the printed wiring board, wherein the spring clip further comprises a first catch extending from the third foot and a second catch extending from the fourth foot, and wherein an alignment pin is positioned adjacent the second catch and extends away from the second catch and the fourth foot.

* * * * *